(12) United States Patent
Arita et al.

(10) Patent No.: US 8,110,481 B2
(45) Date of Patent: Feb. 7, 2012

(54) METHOD OF SEGMENTING SEMICONDUCTOR WAFER

(75) Inventors: Kiyoshi Arita, Fukuoka (JP); Atsushi Harikai, Saga (JP)

(73) Assignee: Panasonic Corporation, Osaka (JP)

( * ) Notice: Subject to any disclaimer, the term of this patent is extended or adjusted under 35 U.S.C. 154(b) by 23 days.

(21) Appl. No.: 12/667,318

(22) PCT Filed: Aug. 7, 2008

(86) PCT No.: PCT/JP2008/064567
§ 371 (c)(1),
(2), (4) Date: Dec. 30, 2009

(87) PCT Pub. No.: WO2009/020245
PCT Pub. Date: Feb. 12, 2009

(65) Prior Publication Data
US 2010/0197115 A1    Aug. 5, 2010

(30) Foreign Application Priority Data

Aug. 7, 2007   (JP) ............................... P2007-205201

(51) Int. Cl.
*H01L 21/00* (2006.01)
(52) U.S. Cl. ........................................ 438/462; 438/464
(58) Field of Classification Search ........... 438/460–465
See application file for complete search history.

(56) References Cited

U.S. PATENT DOCUMENTS

| 6,527,965 | B1 * | 3/2003 | Gee et al. ......................... 216/24 |
| 6,534,386 | B2 * | 3/2003 | Irie ................................. 438/464 |
| 7,927,973 | B2 * | 4/2011 | Haji et al. ....................... 438/462 |
| 2003/0129809 | A1 | 7/2003 | Takyu et al. |

FOREIGN PATENT DOCUMENTS

| JP | 57-114251 A | 7/1982 |
| JP | 59-035447 A | 2/1984 |
| JP | 03-050754 A | 3/1991 |
| JP | 04-255243 A | 9/1992 |
| JP | 04-340729 A | 11/1992 |
| JP | 05-090406 A | 4/1993 |
| JP | 63-029948 A | 2/1998 |
| JP | 2000-340527 A | 12/2000 |
| JP | 2005-019103 A | 1/2005 |
| JP | 2006-156638 A | 6/2006 |
| JP | 2007-194373 A | 8/2007 |
| KR | 2001-0082405 A | 8/2001 |
| WO | 2006/038699 A1 | 4/2006 |

OTHER PUBLICATIONS

International Search Report for PCT/JP2008/064567.

\* cited by examiner

*Primary Examiner* — Kevin M Picardat
*Assistant Examiner* — Neil Prasad
(74) *Attorney, Agent, or Firm* — Pearne & Gordon LLP (57) ABSTRACT

To provide a method of segmenting a semiconductor wafer, which is capable of preventing chippings.

A semiconductor wafer 1 is partitioned into a circumferential ring-shaped region 1a and a segmentation region placed in the inner side of the ring-shaped region 1a. The semiconductor wafer 1 included in the segmentation region is cut into the form of a lattice along a plurality of perpendicular cutting lines 4 and is segmented into a plurality of chips 2. On the other hand, the semiconductor wafer 1 included in the ring-shaped region 1a is cut along two partition lines 5 extending in parallel to the cutting lines 4 from the center O of the semiconductor wafer 1 and is partitioned into four independent regions.

10 Claims, 10 Drawing Sheets

METHOD OF SEGMENTING SEMICONDUCTOR WAFER

TECHNICAL FIELD

The present invention relates to a method of segmenting a semiconductor wafer into a plurality of chips by means of plasma etching.

BACKGROUND ART

As a semiconductor wafer has been thinner and thinner, instead of a method of segmenting a semiconductor wafer into a plurality of chips using a cutting tool such as a blade or the like, where there may occur defects or cracks in the semiconductor wafer, which may lead to low yield, a plasma etching method has recently attracted a great attention. In this plasma etching method, a semiconductor wafer whose circuit forming side is attached with a protective sheet is hermetically sealed in a plasma treating chamber and is segmented into a plurality of chips by subjecting the semiconductor wafer to plasma etching from other side of the semiconductor wafer, the protective sheet serving to prevent the chips from being dispersed and protect circuits (see Patent Document 1).
[Patent Document 1] Japanese Unexamined Patent Application Publication No. 2005-191039

DISCLOSURE OF THE INVENTION

Technical Problem

After the semiconductor wafer is subjected to the plasma etching to be segmented into the plurality of chips, the semiconductor wafer can not keep a flat state, and there occur chippings (defects or cracks) due to contact between adjacent chips by bend or deflection of the protective sheet, which may result in low yield. It is expected that this problem becomes more serious as a gap between adjacent chips becomes smaller and smaller due to narrower etching width.

It is therefore an object of the invention to provide a method of segmenting a semiconductor wafer into a plurality of chips, which is capable of preventing chippings of the chips.

Technical Solution

According to an aspect of the invention, there is provided a method of segmenting a semiconductor wafer into a plurality of chips by means of plasma etching, a protective sheet being provided on a circuit forming surface of the semiconductor wafer, including the steps of segmenting a segmentation region, which is partitioned in an inner side of a ring-shaped region partitioned in the circumference of the semiconductor wafer, into the plurality of chips by cutting the segmentation region along a plurality of perpendicular cutting lines; and partitioning the ring-shaped region into four independent regions by cutting the ring-shaped region along two partition lines extending in parallel to the perpendicular cutting lines from the center of the semiconductor wafer.

Preferably, the method further includes the step of masking a region which is in a rear side of the semiconductor wafer and lies in the outside of the regions corresponding to the cutting lines and the partition line. The masked semiconductor wafer is subjected to plasma etching treatment to segment the segmentation region into the plurality of chips and partition the ring-shaped region into the four independent regions.

Preferably, the method further includes the steps of: attaching a continuous extensible maintenance sheet to the rear side of the semiconductor wafer in which the segmentation region is segmented into the plurality of chips and the ring-shaped region is partitioned into the four independent regions; peeling the protective sheet; and expanding a gap between adjacent chips and a gap between the chips and the ring-shaped region by extending the maintenance sheet from an inner side to an outer side of the semiconductor wafer.

According to another aspect of the invention, there is provided a method of segmenting a semiconductor wafer into a plurality of chips by means of plasma etching, a protective sheet being provided in a circuit forming surface of the semiconductor wafer, including the steps of: segmenting a segmentation region, which is partitioned in an inner side of a ring-shaped region partitioned in the circumference of the semiconductor wafer, into the plurality of chips by cutting the segmentation region along a plurality of perpendicular cutting lines; and partitioning the ring-shaped region into more than five independent regions by cutting the ring-shaped region along partition lines. The partition lines include at least two partition lines extending in parallel to the perpendicular cutting lines from the center of the semiconductor wafer, and a region whose circumferential length is more than ⅛ of the entire circumferential length of the semiconductor wafer is necessarily included in each of the regions partitioned along the two partition lines.

Preferably, the method further includes the step of masking a region which is in a rear side of the semiconductor wafer and lies in the outside of the regions corresponding to the cutting lines and the partition line. The masked semiconductor wafer is subjected to plasma etching treatment to segment the segmentation region into the plurality of chips and partition the ring-shaped region into more than five independent regions.

Preferably, the method further includes the steps of: attaching a continuous extensible maintenance sheet to the rear side of the semiconductor wafer in which the segmentation region is segmented into the plurality of chips and the ring-shaped region is partitioned into more than five independent regions; peeling the protective sheet; and expanding a gap between adjacent chips and a gap between the chips and the ring-shaped region by extending the maintenance sheet from an inner side to an outer side of the semiconductor wafer.

Advantageous Effects

According to the present invention, since bend of the maintenance sheet is suppressed as at least an edge of the semiconductor wafer is not segmented, generation of chippings due to contact between segmented chips is reduced, which results in increase of a yield.

BEST MODE FOR CARRYING OUT THE INVENTION

Figure 1:
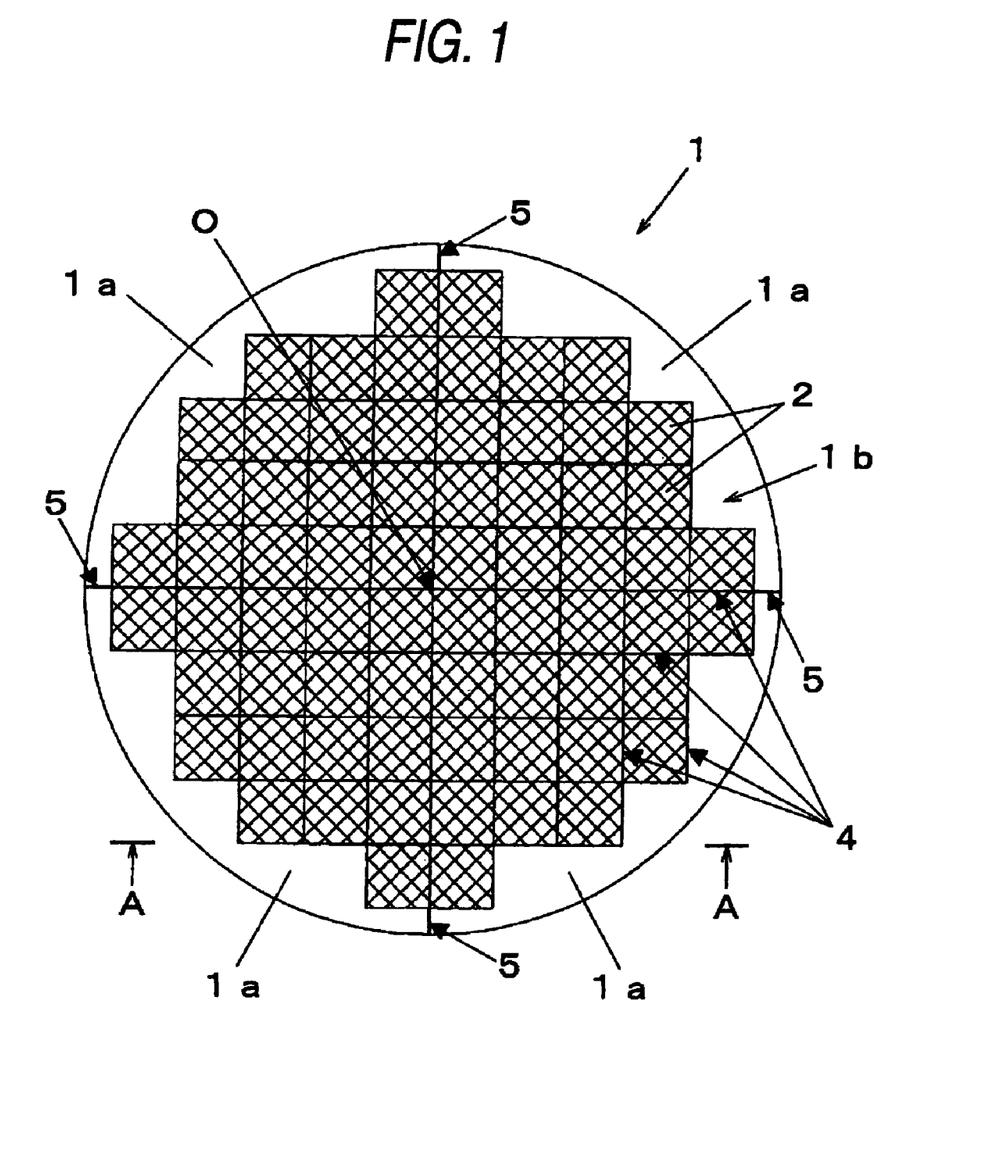
FIG. 1 is a plan view of a segmented semiconductor wafer according to an embodiment of the present invention.
Figure 2:
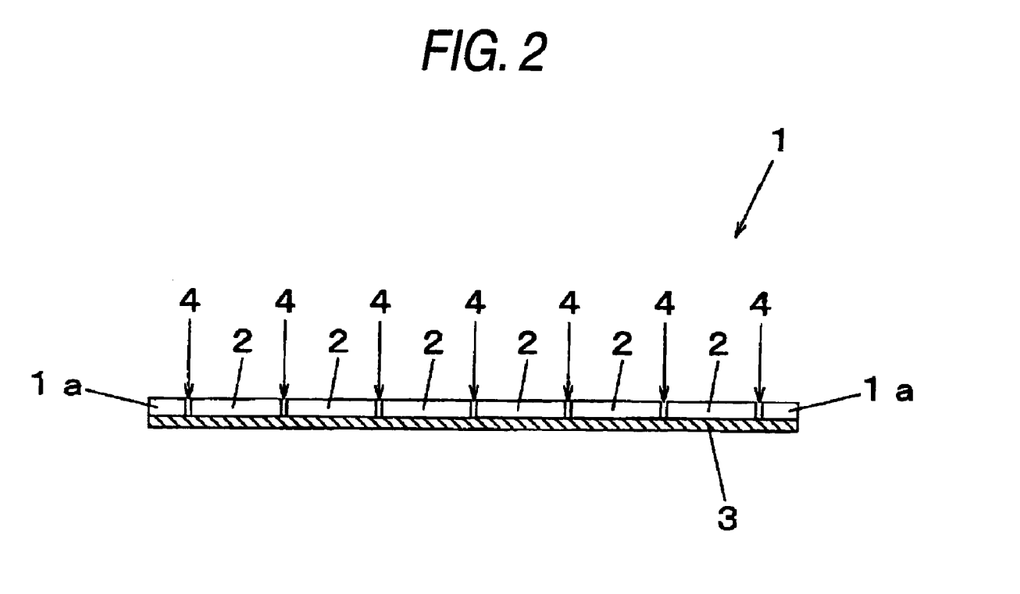
FIG. 2 is a sectional view taken along line A-A in FIG. 1.

Embodiments of the present invention will be hereinafter described with reference to the drawings. FIG. 1 is a plan view of a segmented semiconductor wafer according to an embodiment of the present invention and FIG. 2 is a sectional view taken along line A-A in FIG. 1. A semiconductor wafer 1 is a disk-like plate formed by slicing an ingot, which is made by crystal-growing silicon, germanium, gallium-arsenic or the like into a cylindrical shape, at thickness of 0.5 mm to 1.5 mm. A diameter of the semiconductor wafer 1 is generally 5 inches (125 mm), 8 inches (200 mm) or 12 inches (300 mm). A circuit pattern (integrated circuit) is formed on one surface (circuit forming surface) of the semiconductor wafer 1 and is segmented into a plurality of parts, i.e., chips (IC chips) 2 by means of plasma etching. A protective sheet 3 is attached to the circuit forming surface and serves to prevent the chips 2 from being dispersed and prevent the circuit forming surface from being damaged when the circuit pattern is segmented.

The semiconductor wafer 1 is partitioned into a circumferential ring-shaped region 1a and a segmentation region 1b placed in the inner side of the ring-shaped region 1a. The semiconductor wafer 1 included in the segmentation region 1b is cut into the form of a lattice along a plurality of perpendicular cutting lines 4 and is segmented into a plurality of chips 2. On the other hand, the semiconductor wafer 1 included in the ring-shaped region 1a is cut along two partition lines 5 extending in parallel to the cutting lines 4 from the center O of the semiconductor wafer 1 and is partitioned into four independent regions.

Figure 3:
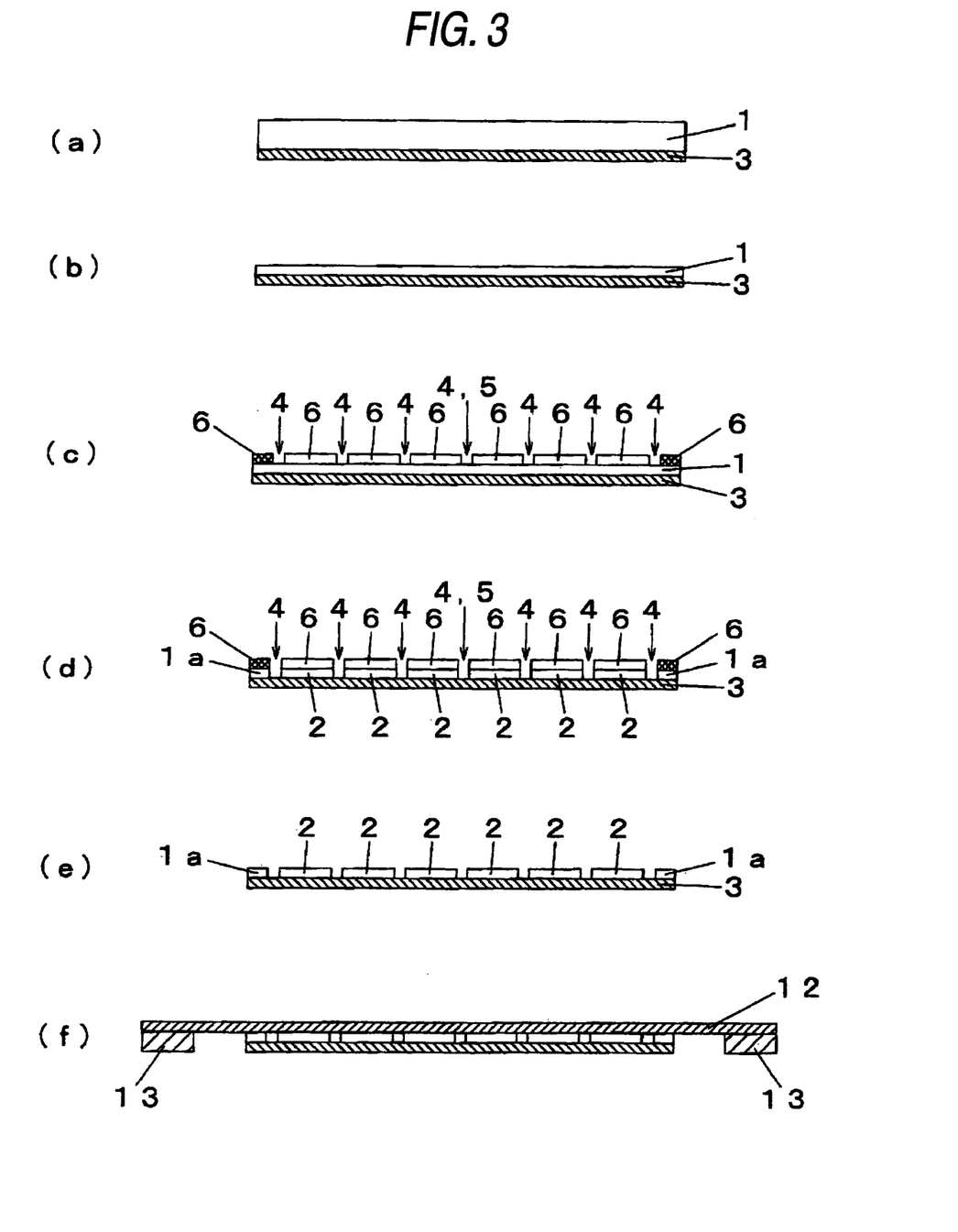
FIG. 3 shows side sectional views for illustrating steps of a method of segmenting a semiconductor wafer by means of plasma etching according to an embodiment of the present invention.

FIG. 3 shows side sectional views for illustrating steps of a method of segmenting the semiconductor wafer. First, (a) the protective sheet 3 is attached to the circuit forming surface of the semiconductor wafer 1, and (b) the semiconductor wafer 1 is polished until it has a predetermined thickness. Next, (c) regions, which are in a rear side of the circuit forming surface of the semiconductor wafer 1 and lie in the outside of the cutting lines 4 and the partition lines 5, are masked with an etching-resistant resist 6. The resist 6 is for masking a portion that will not be etched in a later plasma treating process. The resist 6 masks the entire rear surface of the semiconductor wafer 1 and then portions of the resist 6, which correspond to the cutting lines 4 and the partition lines 5, are removed. Next, (d) the semiconductor wafer 1 is subjected to plasma treatment, the semiconductor wafer 1 is cut along the cutting lines 4 and the partition lines 5, the segmentation region 1b is segmented into the plurality of chips 2, and the ring-shaped region 1a is partitioned into the four independent regions, and (e) the remaining resist 6 is ashed by ozone or plasma in vapor to be completely removed from the semiconductor wafer 1.

Figure 4:
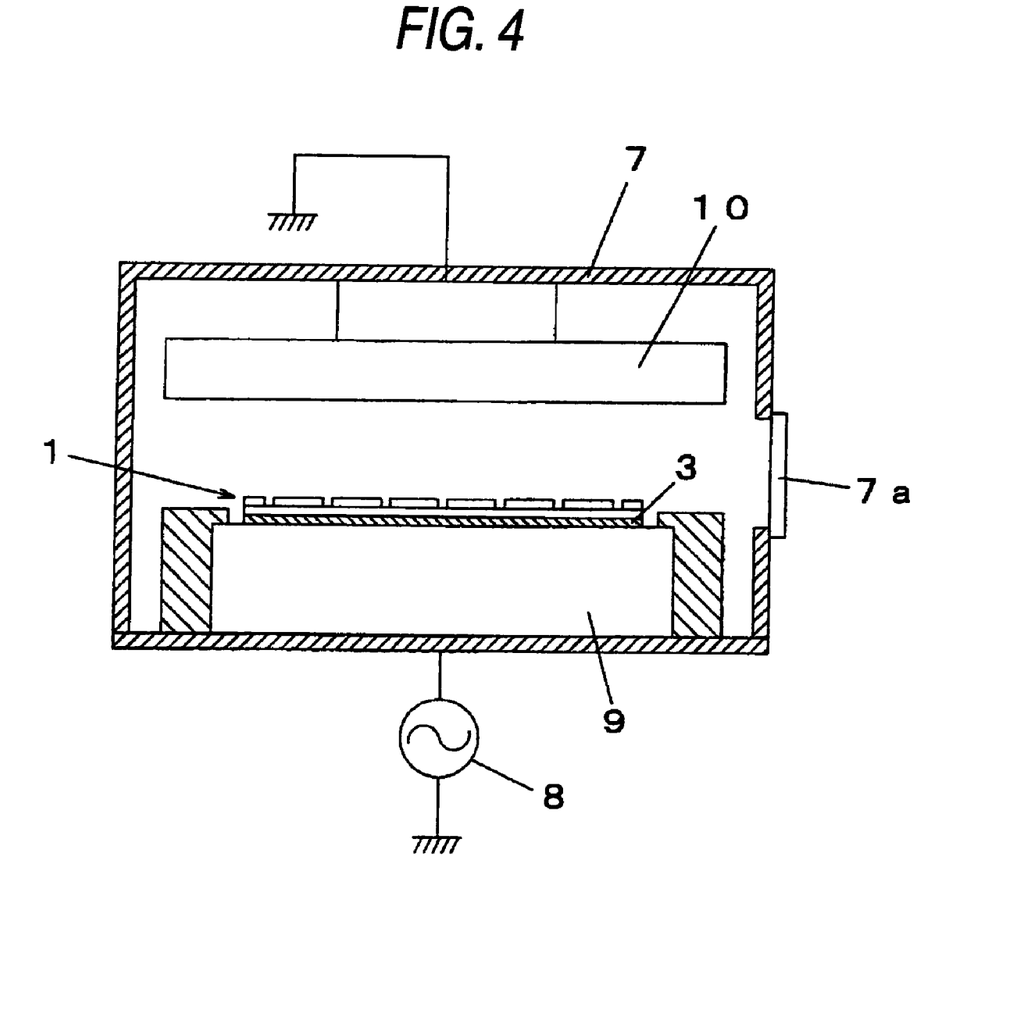
FIG. 4 is a side sectional view showing a state where a semiconductor wafer is carried in a plasma treating chamber, according to an embodiment of the present invention.

FIG. 4 is a side sectional view showing a state where a semiconductor wafer is carried in a chamber for plasma treatment. A chamber 7 forms a sealed space therein, an electrode 9 connected to a high frequency power supply 8 is arranged in a lower side of the chamber 7, and a grounded electrode 10 opposing the electrode 9. The lower electrode 9 also serves as a support of the semiconductor wafer 1. The semiconductor wafer 1 is supported on the electrode 9 with the protective sheet 3 directing downward. When a high frequency voltage is applied to the electrode 9 in a state where the chamber 7 is decompressed below a predetermined pressure and is filled with gas for plasma generation, the semiconductor wafer 1 is cut by plasma etching along the cutting lines 4 and the partitions 5, both of which are not masked with the resist 6.

Figure 5:
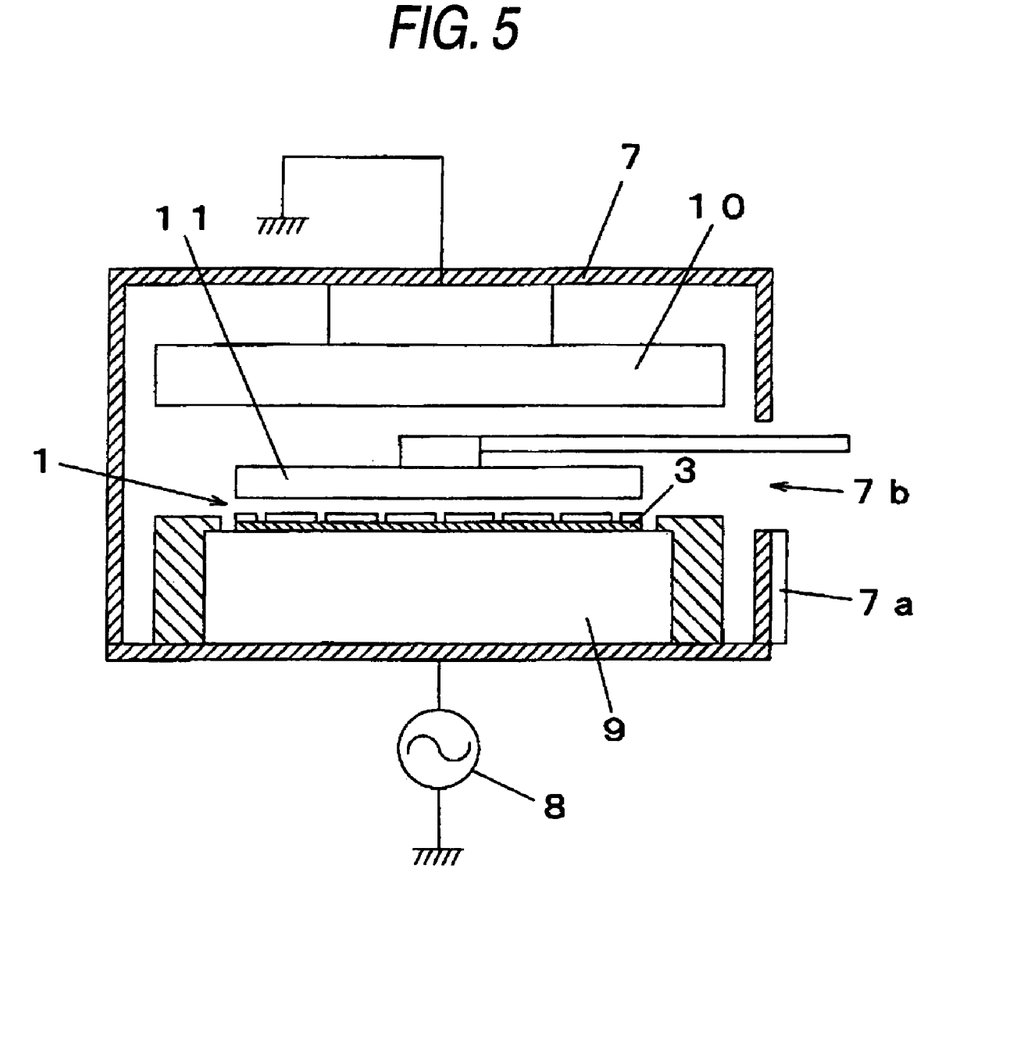
FIG. 5 is a side sectional view showing a state where a semiconductor wafer is carried out of a plasma treating chamber, according to an embodiment of the present invention.

FIG. 5 is a side sectional view showing a state where the semiconductor wafer is carried out of the chamber for plasma treatment. After the chamber 7 is opened to the air, a door 7a of a side wall of the chamber 7 is opened to form an opening 7b and a robot hand 11 is advanced into the chamber 7 through the opening 7b to vacuum-hold the semiconductor wafer 1 from its upper side and carry it out of the chamber 7 with it held to the robot hand 11.

Figure 6:
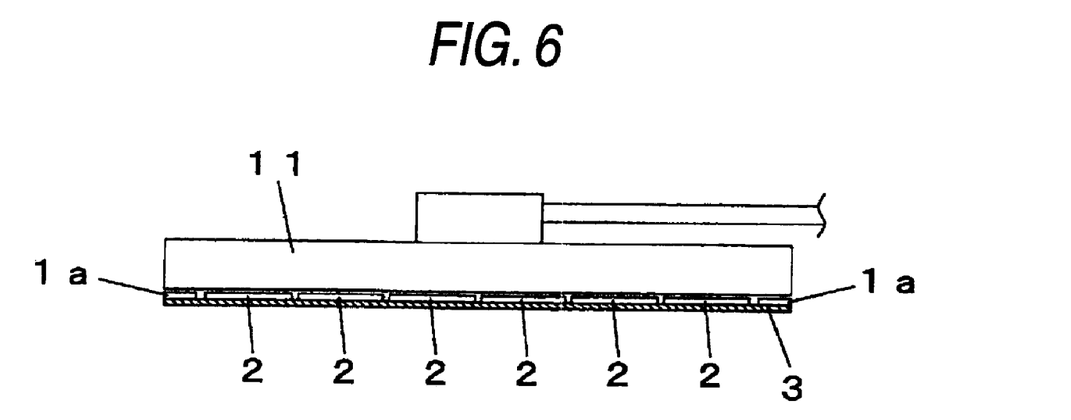
FIG. 6 is a side sectional view showing a state where a semiconductor wafer is absorbed to a robot hand, according to an embodiment of the present invention.

FIG. 6 is a side sectional view showing a state where the semiconductor wafer is vacuum-held to the robot hand. Although the circumferential ring-shaped region 1a of the plasma-etched semiconductor wafer is partitioned into the four independent regions, since each independent region has an area sufficiently larger than the individual chips 2, it has a function of preventing the protective sheet 3 located in an inner side from being bent by its rigidity. On this account, even if there occurs an unbalance of a suction force due to shock, vibration or change of a negative pressure when the robot hand 11 vacuum-holds and carries the semiconductor wafer 1, the bend of the protective sheet 3 is minimized, thereby preventing adjacent chips 2 from contacting with each other, which results in reduction of a risk to generate chippings (defects and cracks).

In the semiconductor wafer 1 carried out of the chamber 7 by the robot hand 11, an extensible maintenance sheet 12 is attached to a rear side of the circuit forming surface and then the protective sheet 3 is peeled out to expose the circuit forming surface, as shown in a part (f) in FIG. 3. A shape maintenance ring 13 having high rigidity is provided in a portion surrounding the plurality of chips 2 of the maintenance sheet 12 in order to maintain flatness and tension of the maintenance sheet 12.

Figure 7:
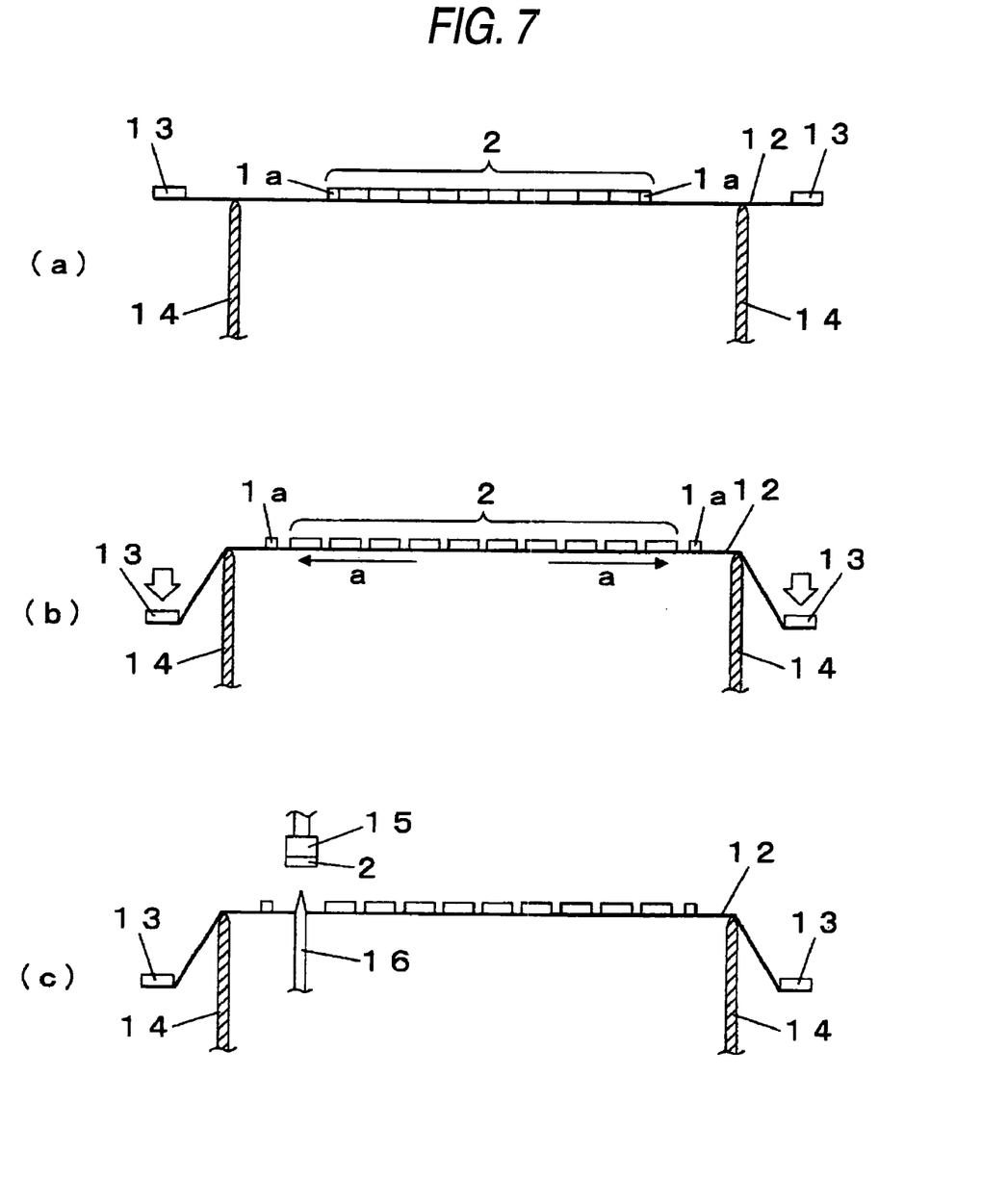
FIG. 7 shows side sectional views showing a state where a semiconductor wafer is mounted on a pickup stage, according to an embodiment of the present invention.
Figure 8:
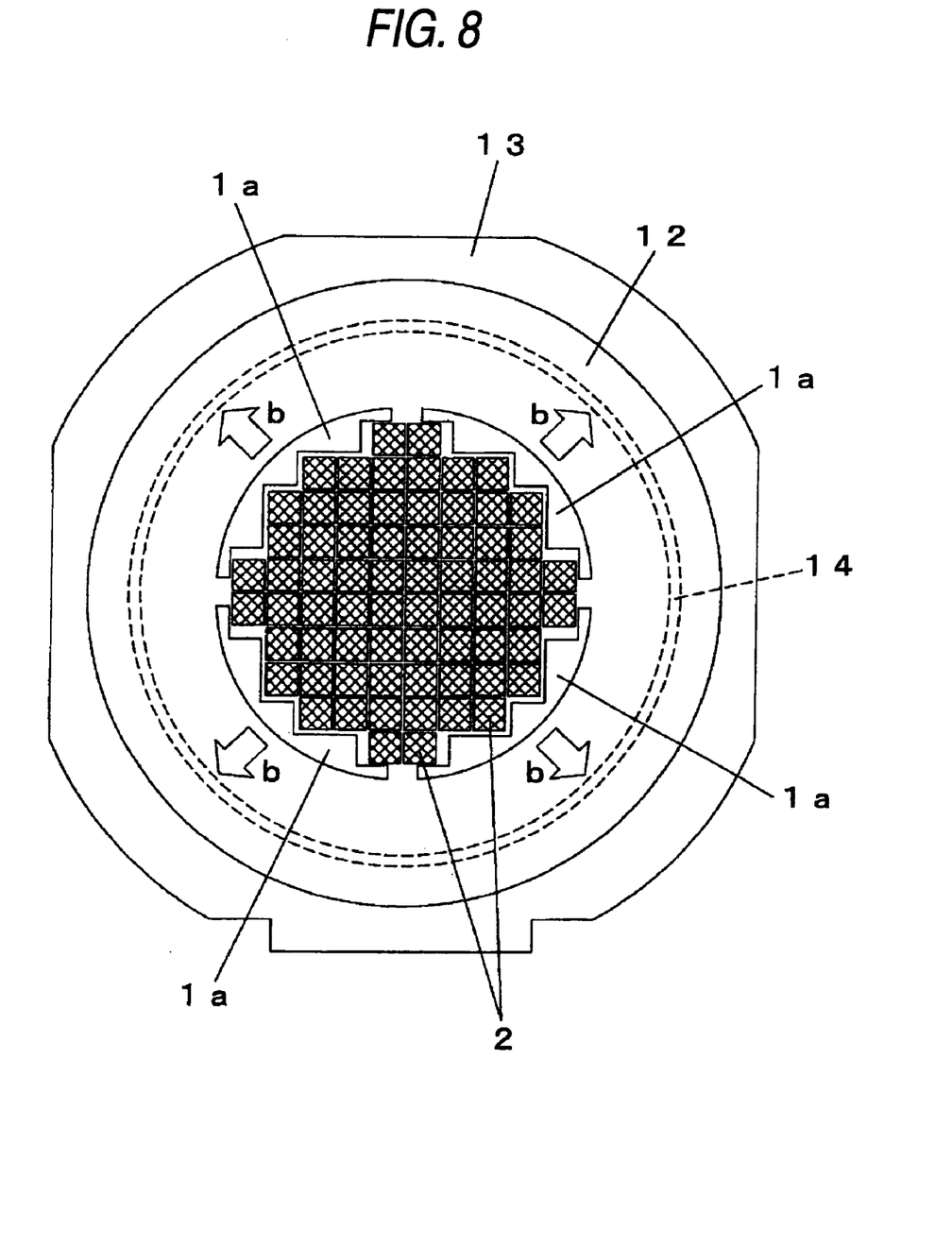
FIG. 8 is a plan view showing a state where a semiconductor wafer is mounted on a pickup stage, according to an embodiment of the present invention.

FIG. 7 shows side sectional views showing a state where the semiconductor wafer 1 is mounted on a pickup stage. (a) The maintenance sheet 12 is placed on a cylindrical expand member 14 provided in the pickup stage with the semiconductor wafer 1 directing upward, (b) the shape maintenance ring 13 is pressed down at an outer side of the expand member 14 and the maintenance sheet 12 is extended in a direction (arrow a) from the inner side to the outer side of the semiconductor wafer 1. As shown in FIG. 8, since the ring-shaped region 1a surrounding the plurality of chips 2 is partitioned into the four independent regions along the perpendicular partition lines, when the maintenance sheet 12 is extended from the inner side to the outer side of the semiconductor wafer 1, the four independent regions of the ring-shaped region 1a are moved (arrow b) in such a manner that they are alienated from each other, the maintenance sheet 12 located at the inner side of the ring-shaped region 1a is extended from the inner side to the outer side of the semiconductor wafer 1, and a gap between adjacent chips 2 and a gap between the chips 2 and the ring-shaped region 1a are widened. (c) With the gap between adjacent chips 2 widened for pickup of the chips, the chips 2 are absorbed by a nozzle 15 from the circuit forming surface, and at the same time, the chips 2 are pushed up by an ejector 16 from a rear side of the maintenance sheet 12 to pick up the chips 2 from the maintenance sheet 12.

In the above-described semiconductor wafer 1, although the circumferential ring-shaped region 1a is partitioned into the four uniform independent regions along the two partition lines 5 extending in the direction in parallel to the cutting lines 4 from the center O of the semiconductor wafer 1, the ring-shaped region 1a may be partitioned into more than five independent regions. In this case, it is a required condition that a region whose circumferential length is more than 1/8 of the entire circumferential length of the semiconductor wafer 1 is necessarily included in each of the four independent regions. Since the region having such a circumferential length has an area sufficiently larger than the individual chips 2, bend of the protective sheet 3 can be effectively suppressed when such a region is arranged in balance in the circumference of the semiconductor wafer 1.

Figure 9:
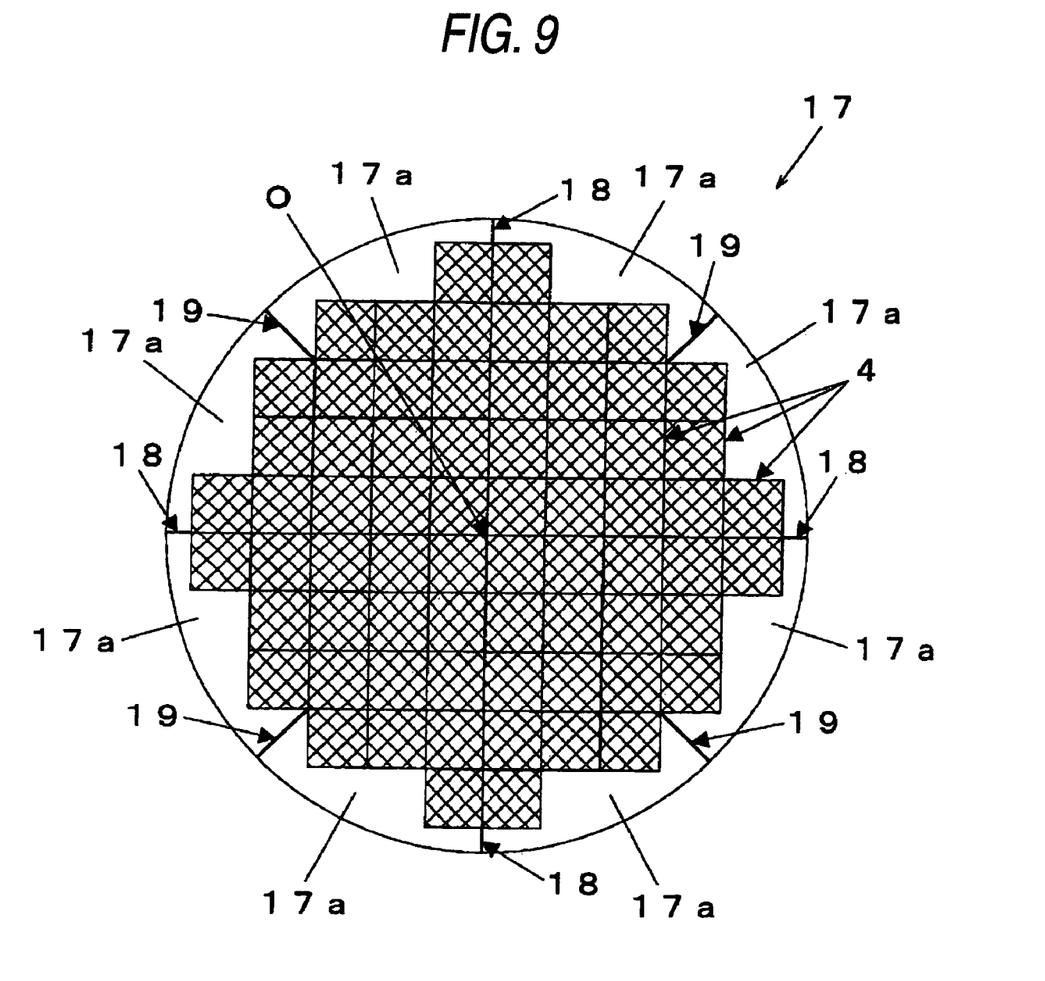
FIG. 9 is a plan view of a segmented semiconductor wafer according to another embodiment of the present invention.
Figure 10:
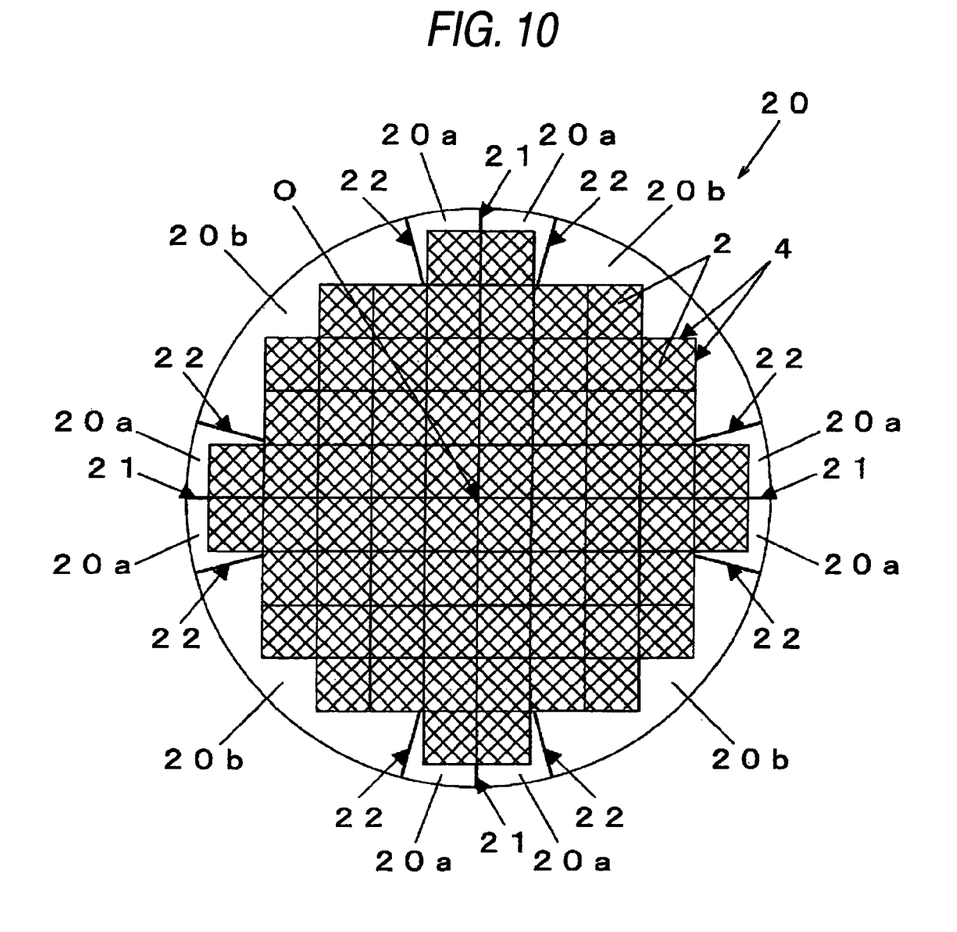
FIG. 10 is a plan view of a segmented semiconductor wafer according to still another embodiment of the present invention.

FIGS. 9 and 10 are plan views of a segmented semiconductor wafer according to another embodiment of the present invention. In a semiconductor wafer 17 shown in FIG. 9, a circumferential ring-shaped region 17a is partitioned into eight independent regions by cutting the ring-shaped region 17a along two partition lines 18 extending in parallel to the cutting lines 4 from the center O of the semiconductor wafer 17 and two partition lines 19 extending in a direction making an angle of 45 degrees with the two partition lines 18. The eight independent regions are equally divided such that their circumferential length corresponds to 1/8 of the entire circumferential length of the semiconductor wafer. Although the eight independent regions each have an area corresponding to 1/2 of an area of each of the four independent regions, since the eight independent regions have the area sufficiently larger than the individual chips 2 and are arranged in balance every center angle of 45 degrees of the semiconductor wafer 17, they can sufficiently exhibit a function of preventing the protective sheet located at the inner side from being bent. In addition, by partitioning the ring-shaped region 17a into the eight independent regions, since a degree of freedom of an extension direction of the maintenance sheet located in the inner side of the ring-shaped region 17a is increased, it is possible to expand the chips 2 with more suitable intervals.

In a semiconductor wafer 20 shown in FIG. 10, a circumferential ring-shaped region is partitioned into 12 independent regions by cutting the ring-shaped region along two partition lines 21 extending in parallel to cutting lines 4 from the center O of the semiconductor wafer 20 and four partition lines 22 similarly extending from the center O. While regions 20a of the 12 independent regions, which are partitioned along the partition lines 21 and the partition lines 22, have a small area, regions 20b partitioned along the partition lines 22 and the partition lines 22 have a circumferential length which is more than 1/8 of the entire circumferential length of the semiconductor wafer and have an area sufficiently larger than the individual chips 2. In addition, since the regions 20b are arranged in balance every center angle of 90 degrees of the semiconductor wafer 20, they can sufficiently exhibit a function of preventing the protective sheet located at the inner side from being bent.

INDUSTRIAL APPLICABILITY

According to the present invention, since the bend of the maintenance sheet is suppressed as at least an edge of the semiconductor wafer is not segmented, generation of chippings due to contact between segmented chips is reduced, which results in increase of a yield, and thus the present invention is useful in a field of semiconductor chip mounting.

The invention claimed is:

1. A method of segmenting a semiconductor wafer into a plurality of chips by means of plasma etching, the semiconductor wafer being partitioned into a ring-shaped non-segmentation region including the perimeter of the semiconductor wafer and a segmentation region placed in an inner side of the ring-shaped non-segmentation region, a protective sheet being provided in a circuit forming surface of the semiconductor wafer, comprising the steps of:
 segmenting the segmentation region into the plurality of chips by cutting the segmentation region along a plurality of perpendicular cutting lines; and
 partitioning the ring-shaped non-segmentation region into four independent non-segmented regions by cutting the ring-shaped non-segmentation region along two partition lines extending in parallel to the perpendicular cutting lines from the center of the semiconductor wafer.

2. The method according to claim 1, further comprising the step of masking a region which is in a rear side of the semiconductor wafer and lies in the outside of the regions corresponding to the cutting lines and the partition line, wherein the masked semiconductor wafer is subjected to plasma etching treatment to segment the segmentation region into the plurality of chips and partition the ring-shaped non-segmentation region into the four independent non-segmented regions.

3. The method according to claim 2, further comprising the steps of:
 attaching a continuous extensible maintenance sheet to the rear side of the semiconductor wafer in which the segmentation region is segmented into the plurality of chips and the ring-shaped non-segmentation region is partitioned into the four independent non-segmented regions;
 peeling the protective sheet; and
 expanding a gap between adjacent chips and a gap between the chips and the ring-shaped non-segmentation region by extending the maintenance sheet from an inner side to an outer side of the semiconductor wafer.

4. A method of segmenting a semiconductor wafer into a plurality of chips by means of plasma etching, the semiconductor wafer being partitioned into a ring-shaped non-segmentation region including the perimeter of the semiconductor wafer and a segmentation region placed in an inner side of the ring-shaped non-segmentation region, a protective sheet being provided in a circuit forming surface of the semiconductor wafer, comprising the steps of:
 segmenting the segmentation region into the plurality of chips by cutting the segmentation region along a plurality of perpendicular cutting lines; and
 partitioning the ring-shaped non-segmentation region into more than five independent non-segmented regions by cutting the ring-shaped non-segmentation region along partition lines,
 wherein the partition lines include at least two partition lines extending in parallel to the perpendicular cutting lines from the center of the semiconductor wafer, and a region whose perimeter length is more than 1/8 of the entire perimeter length of the semiconductor wafer is necessarily included in each of the regions partitioned along the two partition lines.

5. The method according to claim 4, further comprising the step of masking a region which is in a rear side of the semiconductor wafer and lies in the outside of the regions corresponding to the cutting lines and the partition line, wherein the masked semiconductor wafer is subjected to plasma etching treatment to segment the segmentation region into the plurality of chips and partition the ring-shaped non-segmentation region into more than five independent non-segmented regions.

6. The method according to claim 5, further comprising the steps of:

attaching a continuous extensible maintenance sheet to the rear side of the semiconductor wafer in which the segmentation region is segmented into the plurality of chips and the ring-shaped non-segmentation region is partitioned into more than five independent non-segmented regions;

peeling the protective sheet; and expanding a gap between adjacent chips and a gap between the chips and the ring-shaped non-segmentation region by extending the maintenance sheet from an inner side to an outer side of the semiconductor wafer.

7. The method according to claim 1, wherein the perpendicular cutting lines do not reach the perimeter of the semiconductor wafer, and the two partition lines reach the perimeter of the semiconductor wafer.

8. The method according to claim 4, wherein the perpendicular cutting lines do not reach the perimeter of the semiconductor wafer, and the two partition lines reach the perimeter of the semiconductor wafer.

9. The method according to claim 1, wherein each of independent non-segmented regions has an area larger than each of the plurality of chips.

10. The method according to claim 4, wherein each of independent non-segmented regions has an area larger than each of the plurality of chips.

* * * * *